United States Patent [19]
Viallet

[11] Patent Number: 5,917,698
[45] Date of Patent: Jun. 29, 1999

[54] COMPUTER UNIT HAVING DUCT-MOUNTED FAN

[75] Inventor: Franck Viallet, Meylan, France

[73] Assignee: Hewlett-Packard Company, Palo Alto, Calif.

[21] Appl. No.: 09/021,348

[22] Filed: Feb. 10, 1998

[51] Int. Cl.⁶ .................................................. H05K 7/20
[52] U.S. Cl. .................. 361/695; 361/694; 361/690; 361/704; 361/719; 361/818; 257/719; 174/16.1; 165/80.3; 312/223.2
[58] Field of Search ..................... 361/679, 680, 361/687, 688, 690, 691, 695, 697, 704; 165/80.3, 165; 312/223.2, 223.1

[56] References Cited

U.S. PATENT DOCUMENTS

| | | | |
|---|---|---|---|
| 5,208,730 | 5/1993 | Tracy | 361/687 |
| 5,355,278 | 10/1994 | Hosoi et al. | 361/680 |
| 5,497,825 | 3/1996 | Yu | 361/695 |
| 5,559,673 | 9/1996 | Gagnon et al. | 361/695 |
| 5,566,377 | 10/1996 | Lee | 361/695 |
| 5,636,103 | 6/1997 | Bushner | 361/695 |

Primary Examiner—Leo P. Picard
Assistant Examiner—Boris L. Chervinsky

[57] ABSTRACT

A standalone computer unit comprises a housing having an air intake structure and at least one component mounted within the housing which in use generates or dissipates heat. A cooling fan is arranged to generate an air flow within the housing. An elongate duct defines a closed air path from the air intake structure to the component, the duct having an inlet at or near the air intake structure and an outlet at or near the component. The cooling fan is mounted within the duct intermediate the inlet and the outlet. In a preferred embodiment, the duct comprises a portion shaped to define a cradle for receiving and supporting the fan, the fan being retained in the cradle by a resilient strap.

6 Claims, 6 Drawing Sheets

COMPUTER UNIT HAVING DUCT-MOUNTED FAN

FIELD OF THE INVENTION

The present invention relates to the cooling of electronic systems and, more particularly, to a computer unit having a duct-mounted fan.

BACKGROUND OF THE INVENTION

The processors and other components of modern personal computers generate significant amounts of heat in operation and therefore require cooling. Generally, a fan is provided in the computer housing which provides a forced air flow within the housing. Individual components, such as the processor chip itself, which generate significant amounts of heat can be provided with heatsinks for dissipating heat generated by the component. Sometimes, the processor chip itself is cooled by the use of a fan heatsink, in which a fan is mounted on a heatsink on the processor package to blow air across the heatsink.

A variety of duct and baffle arrangements have been proposed and used to manage and direct a cooling airflow within computer housings. Examples of such arrangements can be found in U.S. Pat. No. 5,432,674, published PCT application WO 96/01035 and U.S. Pat. No. 5,422,787.

Whilst the use of a forced air flow can provide effective cooling, the fan necessarily generates undesirable noise.

The object of this invention is to reduce the noise generated by a cooling fan mounted in a stand-alone computer unit.

SUMMARY OF THE INVENTION

In brief, this is achieved by a standalone computer unit including at least one component which in use generates or dissipates heat. The unit comprises a housing having an air intake structure and an air exhaust structure. An elongate duct is provided which defines a closed air path from the air intake structure to the component. Finally, a cooling fan for generating an air flow between the air intake structure and the air exhaust structure is mounted within the duct intermediate an inlet of the duct at or near the air intake structure and an outlet of the duct at or near the component.

In general, the duct or baffle arrangements shown in the prior art place the fan outside the duct either near to an inlet structure or near to an exhaust structure. In the present case, since the fan is mounted within a duct at a distance from the air intake structure, the pressure drop across the air intake structure is reduced. In consequence, the noise generated by the fan, which is thought to be at least partly due to turbulence created by the pressure drop across the air intake structure, is reduced.

To maximise this effect, the fan is preferably mounted in the duct nearer to the outlet than to the inlet.

In a preferred embodiment, the duct comprises a portion shaped to define a cradle for receiving and supporting the fan, the fan being retained in the cradle by a resilient strap. This provides a particularly convenient way of mounting the fan within the duct which provides for quick and easy assembly and which serves to absorb some of the vibration of the fan, thereby further reducing the noise generated by the fan. To further reduce noise, the fan can be supported within the cradle by resilient vibration absorbing material. Where the housing has an electromagnetic shielding structure comprising at least one generally planar shielding member, the duct may conveniently comprise a baffle member of substantially U-shaped section removably fixed to the shielding member.

If the component is a heatsink of a type that is shaped such that there is a preferred direction for a cooling airflow across the heatsink, the duct can be shaped to direct the cooling airflow across the heatsink in that preferred direction.

In the preferred embodiment, the housing comprises two opposed parallel side walls and the component is supported by a circuit board that is mounted within the housing parallel to said side walls. The duct comprises a first portion for directing the air flow substantially parallel to the side walls and a second portion for directing the airflow obliquely with respect to the side walls. The fan is mounted in the duct between said first and second portions.

BRIEF DESCRIPTION OF THE DRAWINGS

A personal computer system unit embodying the invention will now be described, by way of non-limiting example, with reference to the accompanying drawings wherein.

BEST MODE OF CARRYING OUT THE INVENTION

Figure 1:
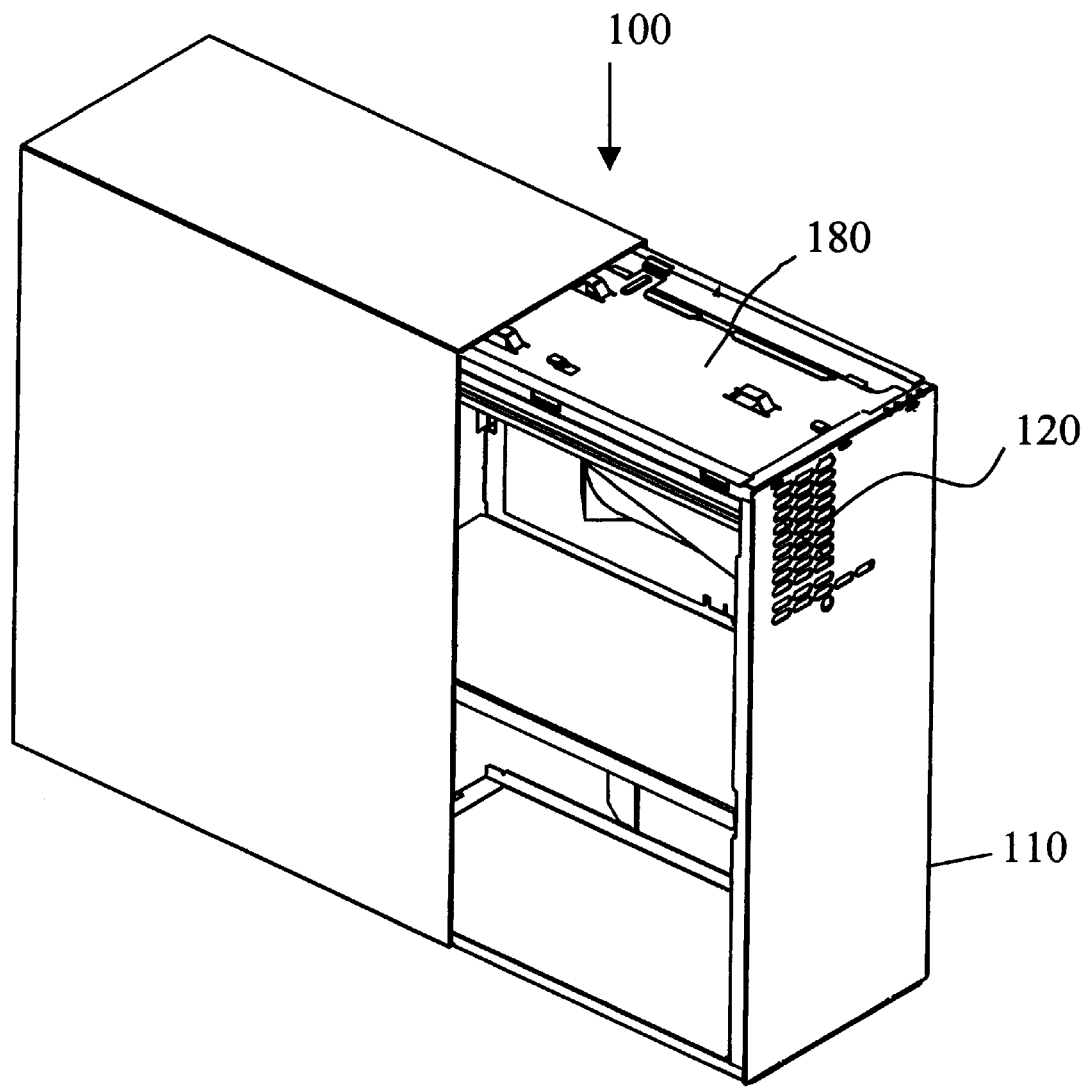
FIG. 1 is a partially exploded perspective view of personal computer system unit.
Figure 2:
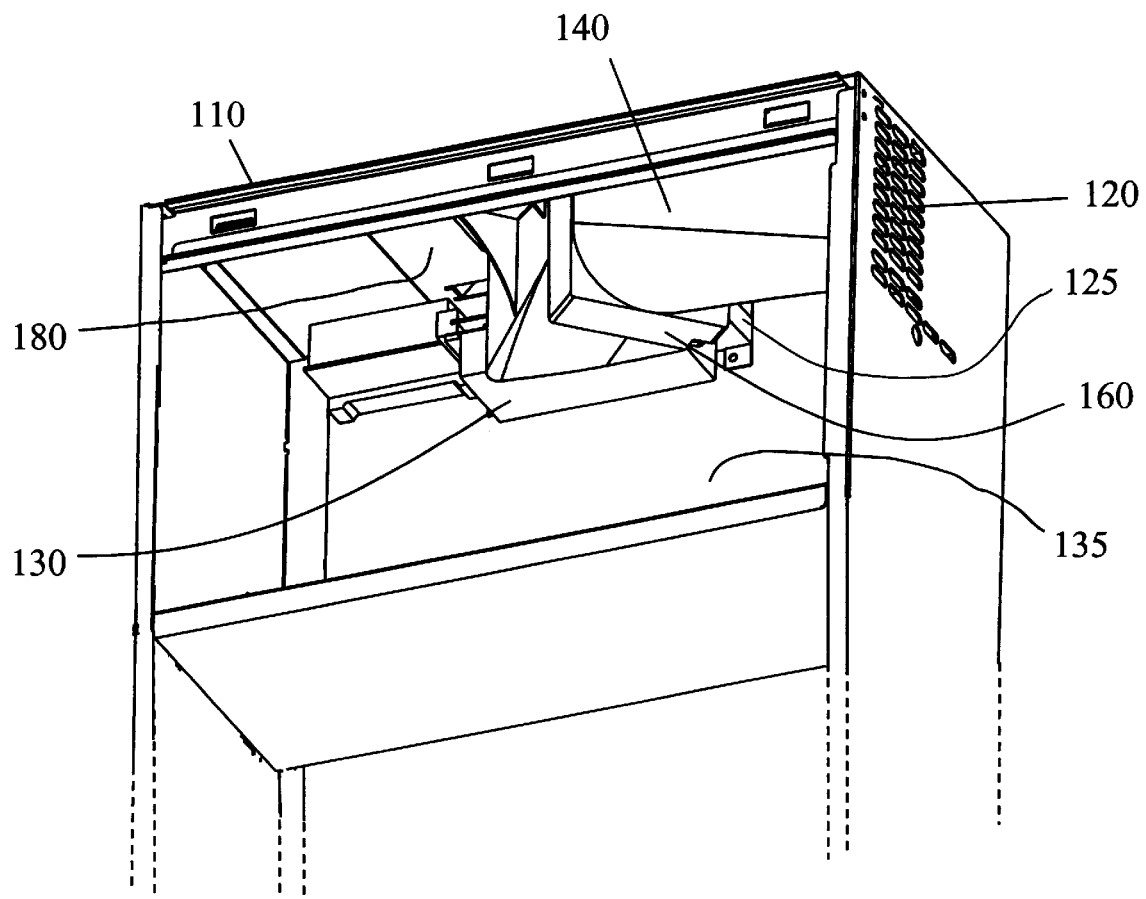
FIG. 2 is a partially exploded view of a personal computer system unit viewed from another angle.

Referring to FIGS. 1 and 2, there is shown a standalone personal computer system unit 100 a tower configuration. Other than as described in the following, the system unit is of generally conventional configuration and construction and includes the components, such as disk drives, power supplies, I/O adapters and the like, which are normally found in personal computer system units. System unit 100 comprises a housing 110 having an air intake structure 120.

As is conventional in such tower units, a computer processor 125 together with an associated heatsink 130 is mounted within the housing on a vertically arranged motherboard 135. In this embodiment, processor 125 is a Pentium II processor available from Intel Corporation (Pentium is a trademark of Intel Corp.). Such processors generate a significant amount of heat in use. This heat is dissipated by heatsink 130 in thermal contact with the processor chip itself.

Figure 3:
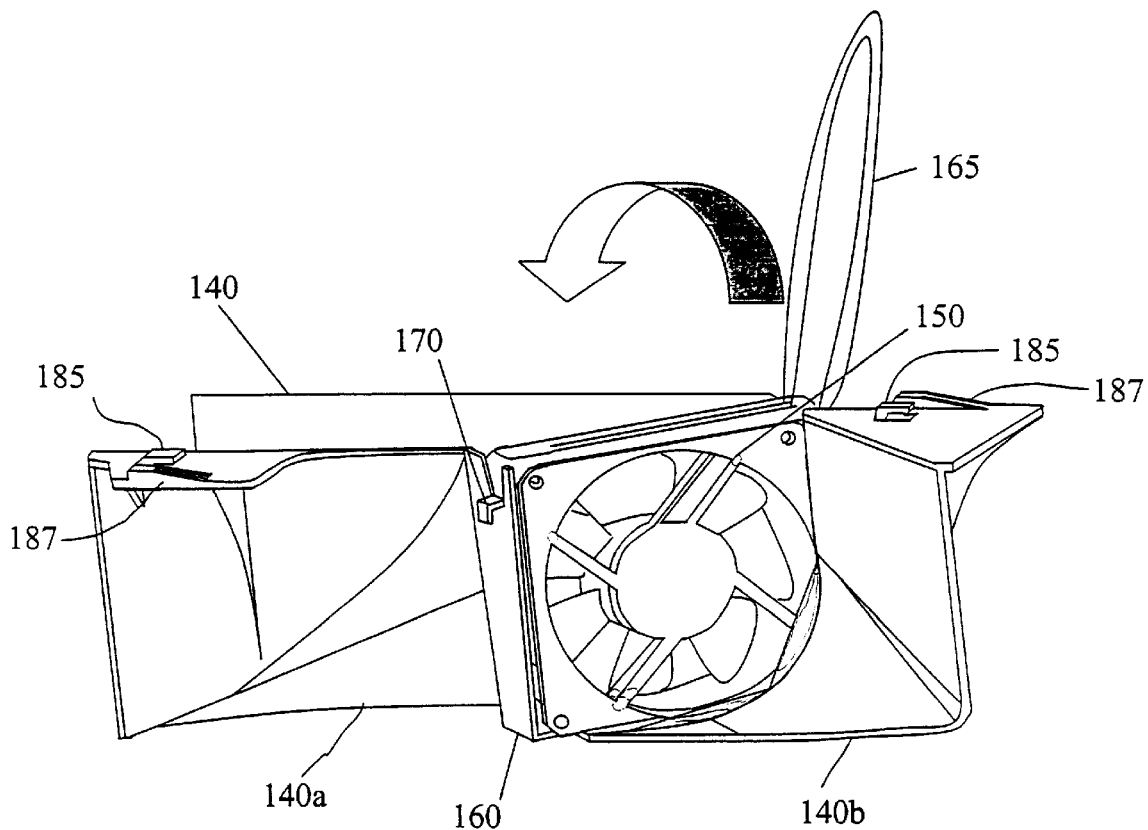
FIG. 3 shows a duct part having a cooling fan mounted therein.
Figure 4:
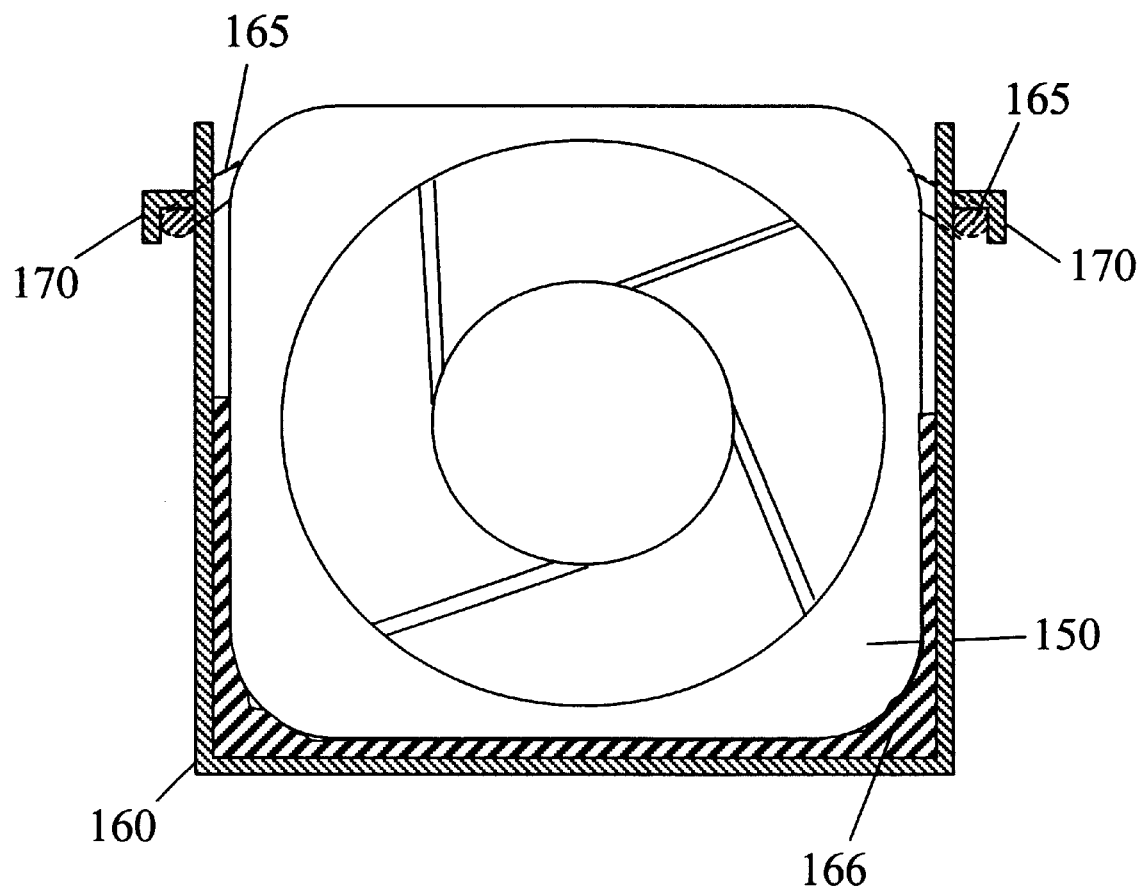
FIG. 4 shows in section a cradle portion of the duct part supporting the cooling fan.

An elongate duct is provided within housing 110 to define a closed air flow path from air intake structure 120 to processor heatsink 130. The duct is formed from a baffle member 140 of substantially U-shaped section within which, as can be seen in FIG. 3, a cooling fan 150 is mounted between the inlet and the outlet nearer to the outlet than to the inlet.

Cooling fan 150 generates an air flow within the housing from air intake structure 120 to processor heatsink 130. As shown in FIGS. 2, 3, 4 and 6, baffle member 140 comprises a portion 160 that is shaped to define a cradle for snugly receiving and supporting cooling fan 150. Fan 150 is retained in cradle portion 160 by a resilient rubber strap 165 which engages (as generally indicated by the arrow in FIG. 3) suitably placed hook portions, such as shown at 170, provided on both sides of cradle portion 160. This provides a particularly convenient way of mounting the fan within the duct which provides for quick and easy assembly. Rubber strap 165 also serves to absorb some of the vibration of the fan, thereby reducing the noise of the system. Suitable additional vibration absorbing material 166 is placed in the cradle around the fan to further absorb vibration from the fan and reduce noise.

In the preferred embodiment, baffle member 140 is made of suitable moulded plastic.

Baffle member 140 comprises a first portion 140*a* for directing the air flow parallel to the side walls of housing 100 and a second portion 140*b* for directing the airflow obliquely with respect to the side walls and the fan is mounted in the duct between said first and second portions. This is because the heatsink 130 is a known type which comprises fins (not shown) shaped such that there is the preferred direction for a cooling airflow diagonally across it. The baffle member is thus shaped to direct the cooling airflow across heatsink 130 in this preferred direction.

Figure 5:
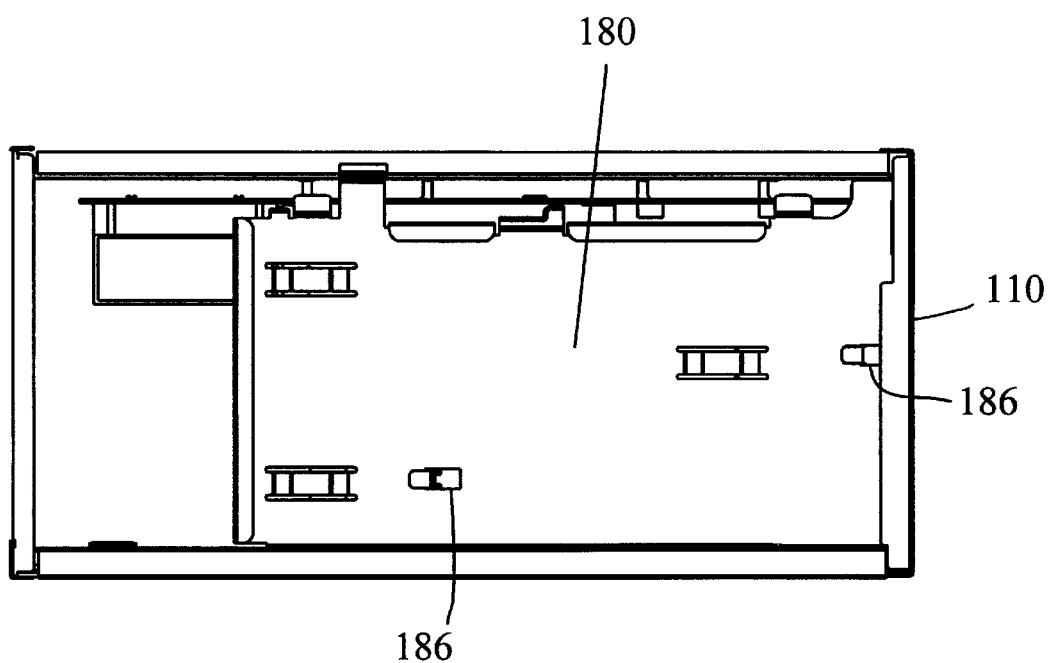
FIG. 5 is a cutaway view from above of the personal computer system unit showing an electromagnetic shielding component having the duct of FIG. 3 mounted thereon.
Figure 6:
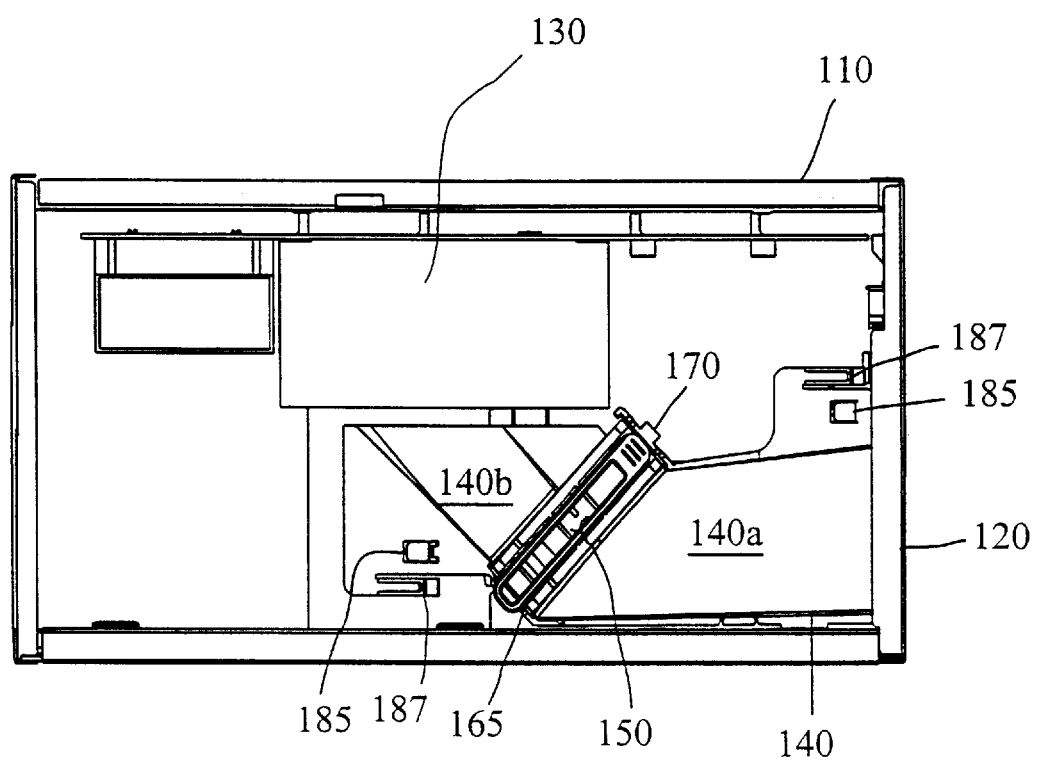
FIG. 6 is a cutaway view from above of the personal computer system unit of FIG. 5 with the electromagnetic shielding component removed.

As shown in FIG. 5, the top side of the air flow path is formed by a planar electromagnetic shielding structure 180 to which the duct comprising at least one generally planar shielding member is clipped via clip members 185 which engage in apertures 186 provided in shielding structure 180.

Wedge shaped boss members 187 serve to provide a tight fit between baffle member 140 and shielding structure 180 when clip members 185 are engaged in apertures 186. Although a specific embodiment of the invention has been described, the invention is not to be limited to the specific arrangement so described. The invention is limited only by the claims.

I claim:

1. A standalone computer unit comprising: a housing having an air intake structure; at least one component mounted within the housing which in use generates or dissipates heat; a cooling fan arranged to generate an air flow within the housing; and an elongate duct defining a closed air path from the air intake structure to the component, the duct having an inlet at or near the air intake structure and an outlet at or near the component, the elongate duct comprising a baffle member of substantially U-shaped section having a fan-mounting portion within the duct intermediate the inlet and the outlet, said fan mounting portion being shaped to define a cradle for receiving and supporting the cooling fan, the unit comprising a resilient strap retaining the cooling fan in the cradle.

2. A computer unit as claimed in claim 1 wherein the fan is mounted in the duct nearer to the outlet than to the inlet.

3. A computer unit as claimed in claim 1 wherein the fan is supported within the cradle by resilient vibration absorbing material.

4. A computer unit as claimed in claim 1 wherein the housing has an electromagnetic shielding structure comprising at least one generally planar shielding member, the baffle member being removably fixed to the shielding member.

5. A computer unit as claimed in claim 1 wherein the housing comprises two opposed parallel side walls and a circuit board mounted within the housing parallel to said side walls, the component being mounted on the circuit board, the duct comprising a first portion for directing the air flow substantially parallel to the side walls and a second portion for directing the airflow obliquely with respect to the side walls, the fan being mounted in the duct between said first and second portions.

6. A computer unit as claimed in claim 1 wherein the component is a heatsink, the duct being shaped to direct the cooling airflow diagonally across the heatsink.

* * * * *